(12) United States Patent
Kremin et al.

(10) Patent No.: US 9,542,588 B2
(45) Date of Patent: Jan. 10, 2017

(54) CAPACITIVE FINGERPRINT SENSOR WITH QUADRATURE DEMODULATOR AND MULTIPHASE SCANNING

(71) Applicant: Cypress Semiconductor Corporation, San Jose, CA (US)

(72) Inventors: Viktor Kremin, Lviv (UA); Paul M. Walsh, Cork (IE); Kaveh Hosseini, Cork (IE); Jaskarn Singh Johal, Mukilteo, WA (US); Erhan Hancioglu, Bothell, WA (US); Onur Ozbek, Kirkland, WA (US)

(73) Assignee: CYPRESS SEMICONDUCTOR CORPORATIONS, San Jose, CA (US)

( * ) Notice: Subject to any disclaimer, the term of this patent is extended or adjusted under 35 U.S.C. 154(b) by 0 days.

(21) Appl. No.: 14/672,036

(22) Filed: Mar. 27, 2015

(65) Prior Publication Data

US 2016/0140376 A1 May 19, 2016

Related U.S. Application Data

(60) Provisional application No. 62/080,700, filed on Nov. 17, 2014.

(51) Int. Cl.
*G01R 27/26* (2006.01)
*G06K 9/00* (2006.01)

(52) U.S. Cl.
CPC ......... *G06K 9/0002* (2013.01); *G01R 27/2605* (2013.01)

(58) Field of Classification Search
CPC . G01R 27/2605; G01R 31/028; G01R 31/312; G01R 31/08; G01R 31/2805; G01D 5/24; G01D 5/2417; H03K 17/962; H03K 17/955; G06F 3/0488; G06F 3/04883; G06F 3/044; G06F 3/04886; G06F 3/045
USPC ......... 324/658, 686, 519, 661; 345/173, 174
See application file for complete search history.

(56) References Cited

U.S. PATENT DOCUMENTS

| | | | | |
|---|---|---|---|---|
| 4,273,958 A | * | 6/1981 | Hirata | H04H 20/49 381/15 |
| 5,852,670 A | * | 12/1998 | Setlak | G06K 9/0002 382/126 |
| 5,920,309 A | * | 7/1999 | Bisset | G06F 3/044 178/18.06 |

(Continued)

OTHER PUBLICATIONS

International Search Report for International Application No. PCT/US2015/050101 dated Dec. 4, 2015; 2 pages.

(Continued)

*Primary Examiner* — Son Le
*Assistant Examiner* — Thang Le

(57) ABSTRACT

A fingerprint sensing circuit, system, and method is disclosed. The fingerprint sensor maybe include a plurality of inputs coupled to a plurality of fingerprint sensing electrodes and to an analog front end. The analog front end may be configured to generate at least one digital value in response to a capacitance of at least one of the plurality of fingerprint sensing electrodes. Additionally, the analog front end may include a quadrature demodulation circuit to generate at least one demodulated value for processing by a channel engine. The channel engine may generate a capacitance result value that is based, in part, on the demodulated value and is stored in a memory.

17 Claims, 13 Drawing Sheets

(56) References Cited

U.S. PATENT DOCUMENTS

| | | | |
|---|---|---|---|
| 5,930,305 A * | 7/1999 | Leib | H04B 1/7115 |
| | | | 329/304 |
| 7,755,369 B2 | 7/2010 | Chuang et al. | |
| 7,876,311 B2 | 1/2011 | Krah et al. | |
| 8,031,094 B2 | 10/2011 | Hotelling et al. | |
| 8,493,331 B2 | 7/2013 | Krah et al. | |
| 8,729,911 B2 | 5/2014 | Maharyta et al. | |
| 8,810,537 B2 | 8/2014 | Yousefpor et al. | |
| 8,860,682 B1 | 10/2014 | Kremin et al. | |
| 8,913,021 B2 | 12/2014 | Elias et al. | |
| 8,918,069 B2 * | 12/2014 | Shen | H04B 1/0475 |
| | | | 330/75 |
| 2002/0015024 A1 | 2/2002 | Westerman et al. | |
| 2002/0067845 A1 * | 6/2002 | Griffis | G06K 9/00026 |
| | | | 382/107 |
| 2003/0035570 A1 * | 2/2003 | Benkley | G06K 9/00026 |
| | | | 382/124 |
| 2004/0201384 A1 | 10/2004 | Berkel | |
| 2006/0089110 A1 * | 4/2006 | Butaye | H03D 7/1425 |
| | | | 455/118 |
| 2007/0038867 A1 | 2/2007 | Verbauwhede et al. | |
| 2007/0182480 A1 * | 8/2007 | Kimura | H03H 11/04 |
| | | | 327/552 |
| 2009/0243633 A1 * | 10/2009 | Brasseur | G01D 5/2405 |
| | | | 324/681 |
| 2009/0252384 A1 | 10/2009 | Dean et al. | |
| 2010/0159858 A1 * | 6/2010 | Dent | H04B 1/123 |
| | | | 455/131 |
| 2011/0063993 A1 | 3/2011 | Wilson et al. | |
| 2011/0176037 A1 | 7/2011 | Benkley | |
| 2013/0207906 A1 * | 8/2013 | Yousefpor | G06F 3/0418 |
| | | | 345/173 |
| 2014/0028577 A1 * | 1/2014 | Krah | G06F 3/0416 |
| | | | 345/173 |
| 2014/0240287 A1 * | 8/2014 | Krah | G06F 3/041 |
| | | | 345/174 |
| 2014/0328522 A1 | 11/2014 | Dean et al. | |
| 2015/0070320 A1 * | 3/2015 | Hong | G06F 3/042 |
| | | | 345/175 |
| 2015/0130731 A1 * | 5/2015 | Chang | G06F 3/0416 |
| | | | 345/173 |
| 2015/0268729 A1 * | 9/2015 | Cehelnk | G06F 3/017 |
| | | | 340/870.3 |
| 2016/0092007 A1 * | 3/2016 | Kanazawa | G06F 3/044 |
| | | | 345/174 |

OTHER PUBLICATIONS

MTCH6301 Projected Capacitive Touch Controller, Retrieved From http://ww1.microchip.com/downloads/en/DeviceDoc/40001663B.pdf, 40 pages.

Tam Vu, et. al, "Distinguishing Users With Capacitive Touch Communication", http://www.winlab.rutgers.edu/~janne/capacitivetouch_mobicom12.pdf, 12 pages.

Tao Peng, et. al, "Touch Panel with Integrated Fingerprint Sensors Based User Identity Management", Retrieved From http://www2.cs.uh.edu/~vprakash/tao.pdf, 7 Pages.

Written Opinion of the International Searching Authority for International Application No. PCT/US2015/050101 dated Dec. 4, 2015; 8 pages.

Zhi Ye, et.al, "High Precision Active-Matrix Self-Capacitive Touch Panel Based on Fluorinated ZnO Thin-Film Transistor" IEEE Journal of Display Technology, 2013, 8 pages.

* cited by examiner

CAPACITIVE FINGERPRINT SENSOR WITH QUADRATURE DEMODULATOR AND MULTIPHASE SCANNING

RELATED APPLICATION

This patent application claims the benefit of U.S. Provisional Patent Application No. 62/080700, filed Nov. 17, 2014, which is incorporated by reference herein.

TECHNICAL FIELD

This disclosure relates generally to electronic systems, and, more particularly, capacitance sensing and fingerprint detection.

BACKGROUND

Capacitance sensing systems can sense electrical signals generated on electrodes that reflect changes in capacitance. Such changes in capacitance can indicate a touch event or the presence of ridges and valleys of a fingerprint. Fingerprint sensing may be used for security and validation applications for a variety of user interface devices, such as mobile handsets, personal computers, and tablets. The use of capacitance sensing for fingerprint detection may allow for a sensor to be placed in the surface of a user interface device with a great degree of configurability. That is, a sensor is not specific to a single location for all devices. Rather, fingerprint sensors may be disposed where convenient to the industrial design and user experience.

Capacitance-based fingerprint sensors work by measuring the capacitance of a capacitive sense element, and looking for a change in capacitance indicating a presence of absence of a fingerprint ridge (or valley). Ridges and valleys at identifiable location on an array may be used to reconstruct the image of the fingerprint for use in enrollment, validation, and security applications. When a fingerprint ridge comes into contact with or is close proximity to a sense element, the capacitance change caused by the fingerprint ridge is detected. The capacitance change of the sense elements can be measured by an electrical circuit. The electrical circuit converts the capacitances of the capacitive sense elements into digital values.

SUMMARY

A fingerprint sensing circuit is disclosed. The fingerprint sensing circuit maybe include a plurality of inputs coupled to a plurality of fingerprint sensing electrodes and to an analog front end (AFE). The AFE may be configured to generate at least one digital value in response to a capacitance of at least one of the plurality of fingerprint sensing electrodes. The AFE may include a quadrature demodulation circuit to generate at least one demodulated value for processing by a channel engine. The channel engine may generate a capacitance result value that is based, in part, on the demodulated value and is stored in a memory.

A method for detecting capacitance of a fingerprint is disclosed. The method may include the steps of:
  receiving a signal from at least one sensing electrode of a fingerprint sensing array in response to a drive signal, the received signal derived from the drive signal on a drive electrode and a mutual capacitance between the drive electrode and the sensing electrode;
  modifying the signal with at least one phase-shifted reference signal to produce a phase-shifted signal;
  converting the phase-shifted signal to a digital value; and
  processing the digital value to produce a result representative of a capacitance of the at least one sensing electrode.

A fingerprint detection system is disclosed. The fingerprint detection system may include a number of drive and receive electrodes configured to have a mutual capacitance between them. The fingerprint detection system may also include a drive circuit coupled to the drive electrodes to produce a drive signal on the drive electrodes. The fingerprint detection system may include an analog front end coupled to the receive electrodes and configured to generate a digital value representative of the mutual capacitance between the drive electrodes and the receive electrodes, the digital value output to a channel engine. The channel engine of the fingerprint detection system may be configured to generate a capacitance value based on the output of the analog front end and to store the capacitance value to a memory.

DETAILED DESCRIPTION

Figure 1:
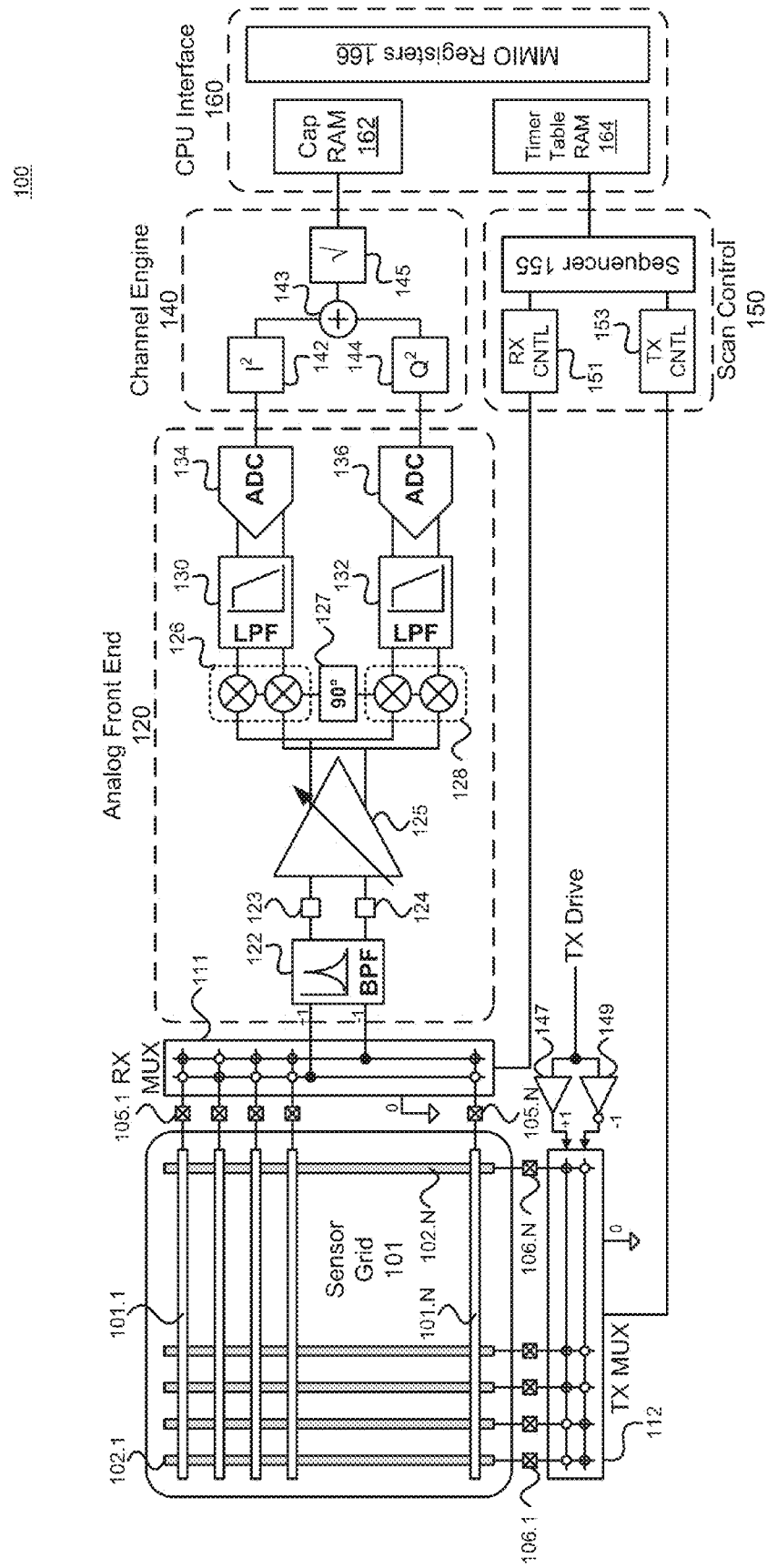
FIG. 1 illustrates fingerprint sensing circuit, according to one embodiment.

In the following description, for purposes of explanation, numerous specific details are set forth in order to provide a thorough understanding of the embodiments of the present invention discussed herein. It will be evident, however, to one skilled in the art that these and other embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

For simplicity and clarity of illustration, reference numerals may be repeated among the figures to indicate corresponding or analogous elements. Numerous details are set forth to provide an understanding of the embodiments described herein. The examples may be practiced without these details. In other instances, well-known methods, procedures, and components are not described in detail to avoid obscuring the examples described. The description is not to be considered as limited to the scope of the examples described herein.

FIG. 1 illustrates a fingerprint sensing circuit 100 according to one embodiment. Sensor grid 101 may be comprised of a plurality of row electrodes 102.1-102.N disposed along a first axis and a plurality of column electrodes 103.1-103.N disposed along a second axis. In one embodiment, the row and column electrodes may be bar-shaped and disposed on a substrate. A mutual capacitance may exist between each row electrode and each column electrode at the intersection between the row and column. This mutual capacitance may be conceptualized as a unit cell which can be measured and assigned a specific identification and capacitance value. Row electrodes 102.1-102.N and column electrodes 103.1-103.N are shown as simple bars, however they may be composed of more complex shapes such as diamonds daisy-chained together to form rows and columns Row electrodes 102.1-102.N and column electrodes 103.1-103.N may also be comprised of multiple electrodes coupled together at one end or both ends.

Row electrodes 102.1-102.N may be coupled to RX pins 105.1-105.N and column electrodes 103.1-103.N may be coupled to TX pins 106.1-106.N. RX pins 105.1-105.N and TX pins 106.1-106.N may be part of an integrated circuit and may be coupled to an RX multiplexer (RX MUX) 111 or a TX multiplexor (TX MUX) 112, respectively. RX MUX 111 and TX MUX may be configured to route signals to and from measurement circuitry to the row and column electrodes through the pins. In one embodiment, RX pins 105.1-105.N may be coupled to analog front end (AFE) 120 configured to convert the mutual capacitance between rows and columns to at least one digital value. AFE 120 may include a band-pass filter block (BPF) 122 which may remove off-band noise components injected by a finger or other conductive object or originating from other sources such as switching regulators coupled to different components of a system. In one embodiment, BPF 122 may be a passive filter, such as an LC filter (shown in FIG. 7). In other embodiments, BPF 122 may be an active filter, which in certain embodiments may be based on a gyrator or other active components. In various embodiments, BPF122 may be constructed using external components, integrated into a sensing circuit with internal circuit elements, or some combination of external components and internal resources.

In one embodiment, RX MUX 111 may couple RX pins 105.1-105.N to BPF 122 to provide a differential input to AFE 120. The output of BPF 122 may be coupled to positive and negative inputs of a variable gain amplifier block (VGA) 125 through additional circuit elements 123 and 124, respectively. In one embodiment, circuit elements 123 and 124 may be coupled to pins, thus coupling AFE 120 to an external BPF. In one embodiment, BPF 122 may be an LC tank (described in FIG. 7, below). VGA 125 may have two outputs coupled to a pair of synchronous detectors 126 and 128 comprised of two switching circuits, the synchronous detectors configured to generate modified outputs for further filtering, conversion, and processing. Synchronous detectors 126 and 128 may be constructed using switching circuits coupled to quadrature detector reference signal source 127; synchronous detectors 126 and 128 may also be analog multipliers. In one embodiment, the frequency of the quadrature detector reference signal may be the same as a TX signal placed on column electrodes 103.1-103.N through TX MUX 112.

Multiphase scanning on the TX portion of the sensing array ("multiphase TX"), multiphase scanning on the RX portion of the sensing array ("multiphase RX"), or a combination of multiphase scanning on both the TX and RX portions of the sensing array ("multiphase TX/RX") may be used in various embodiments. Multiphase scanning may be accomplished with TX and RX multiplexers, like TX MUX 112 and RX MUX 111, with following capabilities:

a output (TX) multiplexer configured to couple a plurality of TX electrodes 103.1-103.N to a positive polarity or a negative polarity drive signal simultaneously, and an input (RX) multiplexer configured to couple a plurality of RX electrodes 102.1-102.N to inverting and non-inverting VGA electrode inputs simultaneously.

When configured for multiphase TX each TX electrode may be coupled to a 3:1 MUX so that the TX electrode may be coupled to one of the three signal sources: non-inverted TX 147, inverted TX 149 or ground (not shown). TX MUX may be controlled such that it may receive one of three values, +1, 0, or −1, corresponding to the non-inverted TX 147, ground, or inverted TX 149, respectively.

When operating in a mode capable of multiphase RX, one differential receiver may be coupled to the all RX electrodes. In one embodiment, all of the RX electrodes may be coupled to the differential receiver. In other embodiments, a different groupings of RX electrodes may be coupled to the differential receiver in various configurations. The polarity of the connection for each RX electrode maybe described as:

0, RX electrode disconnected from receiver; the RX electrode may be coupled to ground, it may be floating, or it may be coupled to some other signal, 1, RX line is coupled to the positive input of a differential receiver, −1, RX line is coupled to the negative input of a differential receiver).

Multiphase RX scanning may be accomplished by coupling multiple RX electrodes to the inverting and non-inverting receiver inputs and multiple TX electrodes to the non-inverting and inverting TX driver outputs in various configurations in different scanning phases. Multiphase scanning may allow increased immunity to external noise, such as noise generated from charging circuits.

Figure 6:
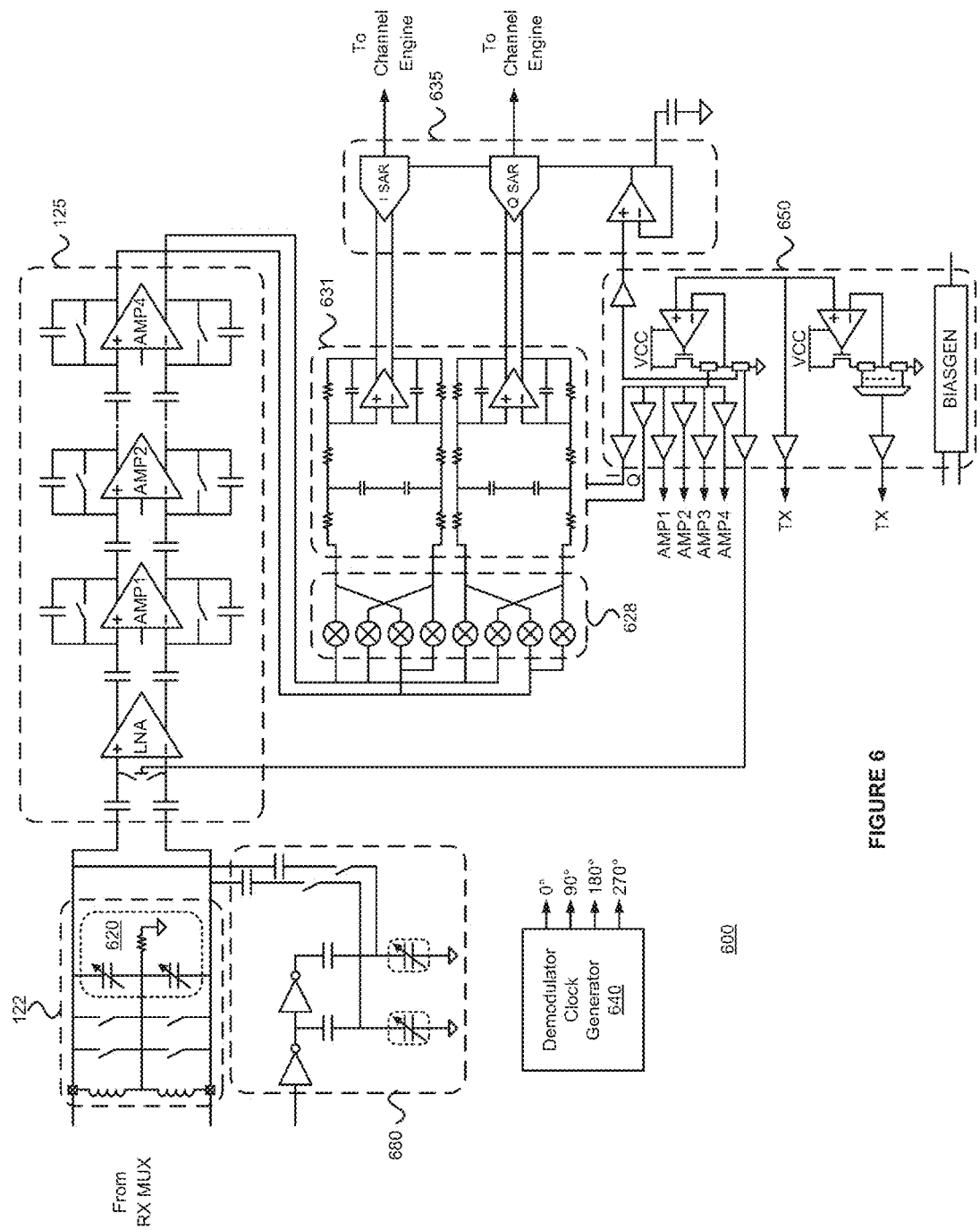
FIG. 6 illustrates an analog front end of a fingerprint sensing circuit, according to one embodiment.
Figure 11:
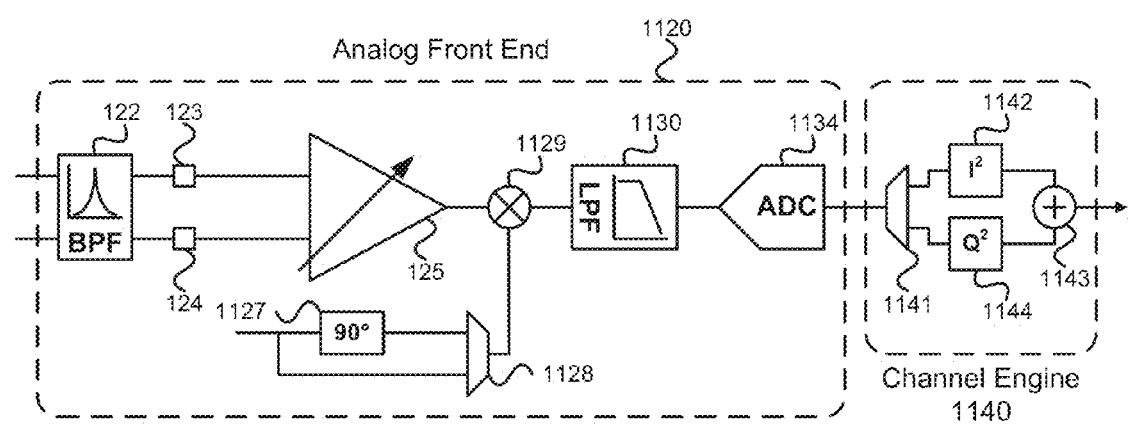
FIG. 11 illustrates an analog front end with a pseudo-quadrature channel, according to one embodiment.

The quadrature demodulator receives a pair of phase-shifted clocks and demodulates the signal from the amplifier chains into two components: I ("in-phase") and Q ("quadrature phase"). The I and Q phase may be either differential or single-ended, depending on the amplifier implementation. FIG. 1 illustrates an embodiment of a differential IQ demodulator. FIG. 11 illustrates an embodiment of a single-ended IQ demodulator. The demodulator modifies the input signal by multiplying or mixing the pair of quadrature-shifted (0° and 90°) demodulator reference signals. A differential input demodulator, like the embodiment of FIG. 1, may use a pair of differential quadrature reference phase-shifted signals (0°-180°, 90°-270°) for I and Q channels, respectively. An embodiment of a demodulator is shown in FIG. 6, where each I and Q demodulator channel includes four switches, driven by demodulator reference signals.

The outputs of each of synchronous detectors 126 and 128 may be coupled to low-pass filter blocks (LPFs) 130 and 132 to remove high-frequency conversion products, thus providing a level DC component to analog-to-digital converters 134 and 136. ADCs 134 and 136 may convert the analog signal (voltage) to a digital value.

The outputs of ADCs 134 and 136 may function as the outputs of AFE 120. The outputs of AFE 120 may be coupled to a channel engine 140. Channel engine 140 may include logic to square each of the quadrature component outputs of the AFE, as shown in $I^2$ block 142 and $Q^2$ block 144. Channel engine 140 may include summing logic 143 to combine the squared values of the quadrature component outputs of AFE 120. Finally, channel engine 140 may include root logic 145 for calculating the square root of the summed, squared quadrature component outputs of AFE 120. The output of channel engine 140 may be a result, R, which may be given by Equation 1:

$$R = \Sigma_{n=0}^{N}(\sqrt{I_n^2 + Q_n^2}), \quad (1)$$

where n is the ADC sample number and N is the total number of accumulated ADC samples. The output of channel engine 140 does not depend on the input signal phase, which may eliminate the need for complex calibration steps.

In various embodiments, channel engine140 may complete additional functions, including but not limited to calculation of minimum and/or maximum capacitance values, calculation of minimum and/or maximum capacitance change values, RMS calculation, and baseline calculation and update, offset subtraction, and scaling of accumulated results.

The output of channel engine 140 may be passed to a memory, such as a capacitance value storage memory (Cap RAM) 162, which may be part of a CPU interface 160. CPU interface 160 may also include MMIO registers 166 to program sequencer 155 by CPU 160 (e.g, setting number of TX pulses per pixel) and a Timer Table memory (Timer Table RAM) 164 to program timing for all sequencer control signals (e.g. input tank reset duration prior scanning cycle starts). Timer Table RAM 164 may include an output that is passed to a scan control block 150.

Scan control block may include an RX control block 151 and a TX control block 153, both coupled to sequencer 155. The outputs of RX control block and TX control block may be coupled to RX MUX 111 and TX MUX 112, respectively. The control of TX MUX 112 may provide a drive (TX) signal to the column electrodes 103.1-103.N. The TX signal may be generated from amplifiers (drivers) 147 and 149. In one embodiment, amplifiers 147 and 149 and TX MUX 112 may be configured to provide a differential TX signal to column electrodes 103.1-103.N. In another embodiment, a single TX signal may be applied, thus providing a non-differential signal to the column electrodes 103.1-103.N.

Figure 2:
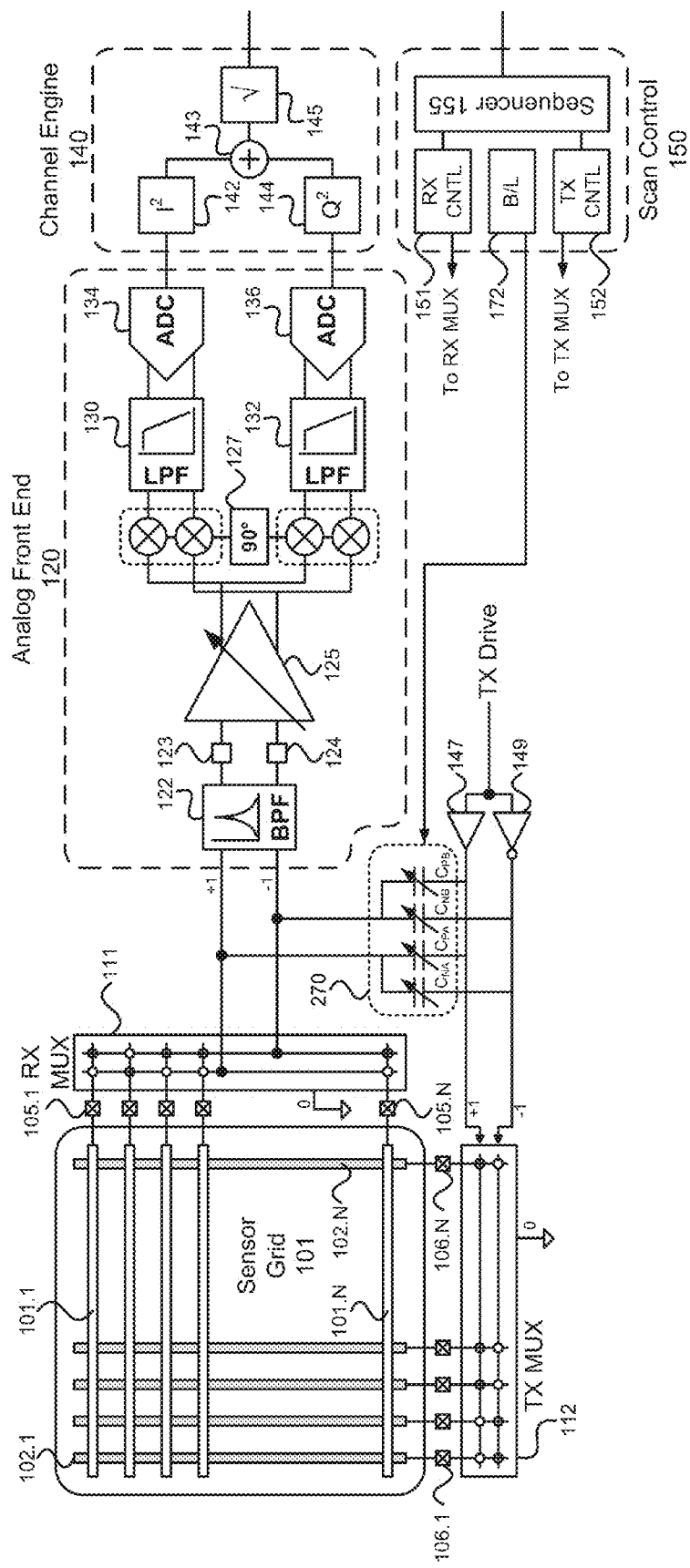
FIG. 2 illustrates a portion of the fingerprint sensing circuit from FIG. 1 with a capacitance baseline compensation circuit, according to one embodiment.

FIG. 2 illustrates another embodiment of sensing circuit 200. Sensing circuit 200 may include a capacitance compensation circuit 270 coupled between the outputs of RX MUX 111 and TX MUX 112. Capacitance compensation circuit 270 may include a number of variable capacitance capacitors ($C_{NA}$, $C_{PA}$, $C_{NB}$, and CPB) coupled between the output of the amplifiers 147 and 149 and the outputs of RX MUX 111. The values of the variable capacitance capacitors may be controlled by a baseline compensation lookup table (B/L) 272 which may be part of scan control block 150 and configured by CPU Interface 160 (shown in FIG. 1). Values of the variable capacitance capacitors, in concert with the TX signals from amplifiers 147 and 149 may induce a current beyond that which is received on RX MUX 111 from row electrodes 102.1-102.N. In one embodiment, the values of the variable capacitance capacitors may be configured for each mutual capacitance to tune LC tank for the best filtered signal. In another embodiment, the values the of the variable capacitance capacitors may be set globally for all mutual capacitances of sensor grid 101. In still another embodiment, some combination of global settings and individual settings may be used.

Figure 3:
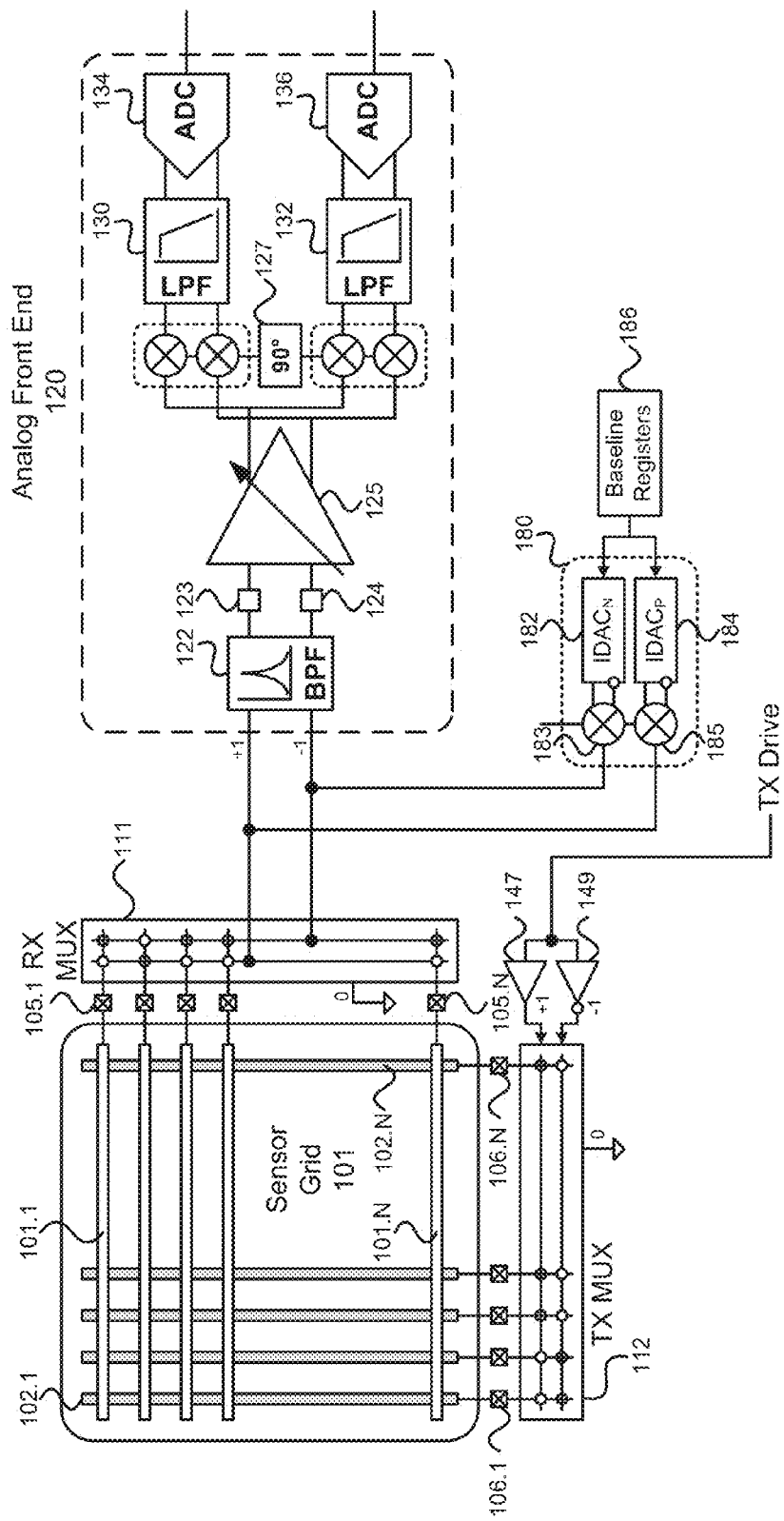
FIG. 3 illustrates a portion of the fingerprint sensing circuit from FIG. 1 with a current DAC baseline compensation circuit, according to one embodiment.

FIG. 3 illustrates another embodiment of sensing circuit 300. Sensing circuit 300 may include a current source-based baseline compensation circuit 180 coupled between RX MUX 111 and BPF 122. Current baseline compensation circuit 180 may include current sources IDACN 182 and IDACp 184, each with differential outputs coupled to a corresponding switching circuit 183 and 185. Current baseline compensation circuit 180 may be configured to provide compensation current to the differential outputs of RX MUX and set by baseline registers 186 and controlled by either CPU interface 160 (shown in FIG. 1) or scan control block 150. Current baseline compensation circuit 180 may inject current directly, as opposed to the embodiment of FIG. 2, wherein baseline compensation currents are injected using variable capacitor circuit, driven by TX signal.

Figure 4:
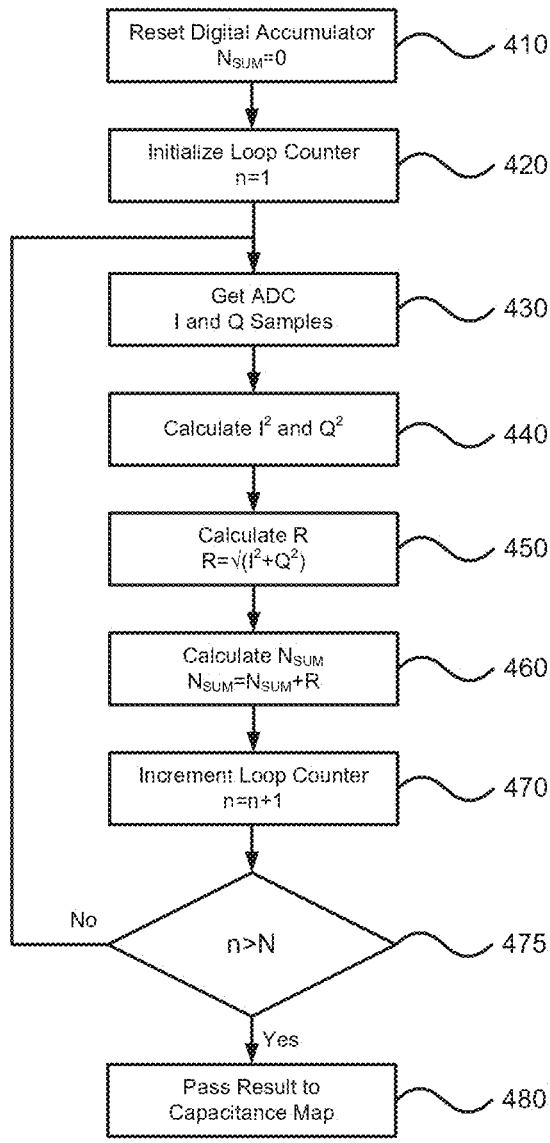
FIG. 4 illustrates a method for processing capacitance values in quadrature, according to one embodiment.

FIG. 4 illustrates a method 400 of operating AFE 120 and channel engine 140 according to one embodiment. First, a digital accumulator may be reset such that the value of the digital accumulator, Nsui, is equal to zero in step 410. A loop counter value, n, may then be set to 1 in step 420. The outputs of AFE 120 (from ADCs 134 and 136) may be gathered in step 430 and the squares of each ($I^2$ and $Q^2$) calculated in step 440. A result may be calculated in step 450. In one embodiment, R may be calculated as the square root of the sum of $I^2$ and $Q^2$ (see Equation 1) R may then be added to the value of the digital accumulator $N_{SUM}$ so that $N_{SUM} = N_{SUM} + R$ in step 460. The loop counter value, n, may then be incremented in step 470. If the loop counter value, n, is greater than $N_{SUM}$ in decision step 475, the result value, R, may be passed to the capacitance map saved in Cap RAM 162 from FIG. 1. If the loop counter value, n, is not greater than $N_{SUM}$, method 400 may return to step 430 and the samples from ADCs 134 and 136 gathered again for processing.

In still other embodiments, channel engine 140 may provide additional averaging or filtering of the outputs of ADCs 134 and 136. For example, channel engine 140 may accumulate I and Q values from ADCs 134 and 136 at a first stage and calculate the squares of the accumulated I and Q values. Channel engine may then calculate the square root o the summed value.

Figure 5:
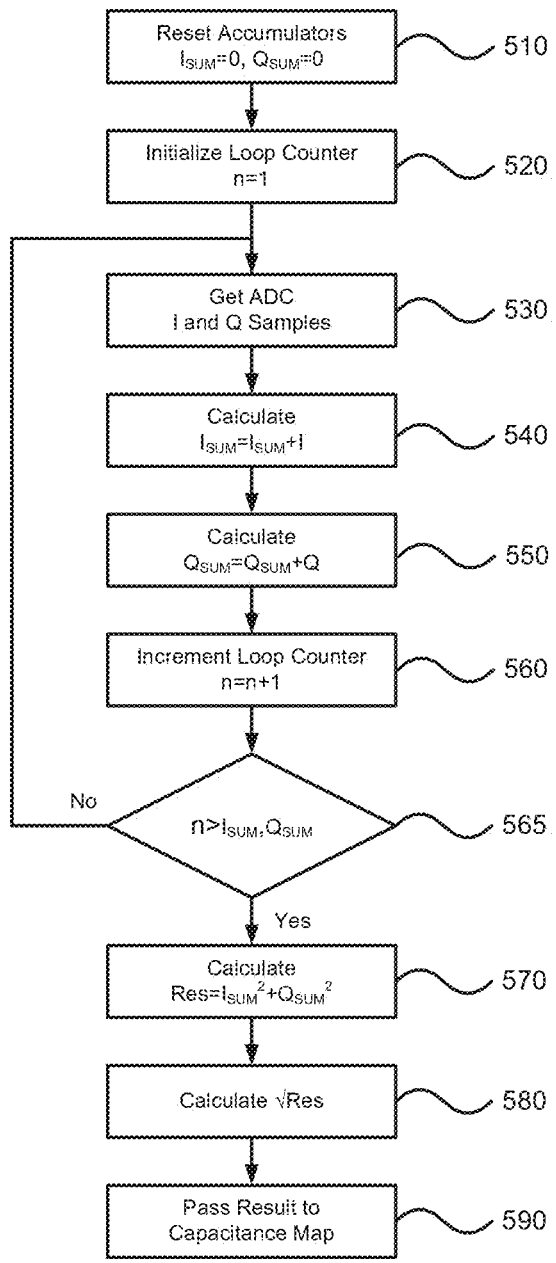
FIG. 5 illustrates another method for processing capacitance values in quadrature, according to one embodiment.

FIG. 5 illustrates a method 500 of operating AFE 120 and channel engine 140 according to another embodiment. Method 500 may use separate accumulators for the I and Q outputs of AFE 120 (from ADCs 134 and 136). These accumulators may be reset in step 510 so that $I_{SUM}$ is equal to zero and $Q_{SUM}$ is equal to zero. A loop counter value may then be set equal to 1 in step 520. As in method 400, the outputs of AFE 120 (I and Q outputs from ADCs 134 and 136, respectively) may be gathered in step 530. Values for the accumulators from step 510 may be updated to equal $I_{SUM} + I$ in step 540 and $Q_{SUM} + Q$ in step 550 for the I and Q outputs, respectively. The loop counter value, n, may then be incremented in step 560. If the loop counter value, n, is greater than the values of $I_{SUM}$ and $Q_{SUM}$, in decision step 565, a result value, Res, may be calculated as $I_{SUM}^2 +$ $Q_{SUM}^2$ in step 570. The square root of the result value, Res, may be calculated in step 580; Res may be given by Equation 2.

$$Res = \sqrt{(\Sigma_{n=0}^N I_n)^2 + (\Sigma_{n=0}^N Q_n)^2} \qquad (3)$$

Res may be passed to the capacitance map saved in Cap RAM 162 from FIG. 1. If the loop counter value, n, is not greater than N, method 500 may return to step 530 and the samples from ADCs 134 and 136 gathered again for processing.

FIG. 6 illustrates an RX channel using various elements of FIGS. 1, 2, and 3. Signals from RX MUX 111 may be received by BPF 122. BPF 122 may include an LC tank, shown in detail in FIG. 7, below. BPF 122 may also include a Cap DAC 620, configured to tune the LC tank and BPF to a resonant frequency. The output of BPF 122 may be passed to VGA 125, which may include a low-noise amplifier (LNA) and a number of amplifiers (AMP1-4). In various embodiments, the number of LNAs and amplifiers may be increased or decreased. The output of VGA 125 may be passed a quadrature demodulation circuit 628 comprised of multiple synchronous detector circuits and associated switching elements to provide demodulated signals to filter block 631. Filter block 631 may represent LPFs 130 and 132 of FIG. 1 and provide a DC output to ADC block 635. ADC block may represent ADCs 134 and 136 of FIG. 1 and provide digital representations of capacitance measured on the mutual capacitances between rows and columns of sensor grid 101 of FIG. 1. RX channel 600 may also include a baseline compensation circuit 680 analogous to those illustrated in FIGS. 2 and 3. Baseline compensation circuit 680 may include buffer circuits and variable capacitance capacitors for inducing current on the output of BPF 122 before the signals are gained by VGA 125. Demodulator clock generator 640 may provide clock signals to quadrature demodulation circuit 628 to produce quadrature output signals that are filtered by filter block 631. Bias circuit 690 may provide reference voltages and drive signals to various elements of RX channel 600, including the amplifiers, the drive electrodes (column electrodes 103.1-103.N of FIGS. 1, 2, and 3), and I and Q signals for filter block 631.

Figure 7:
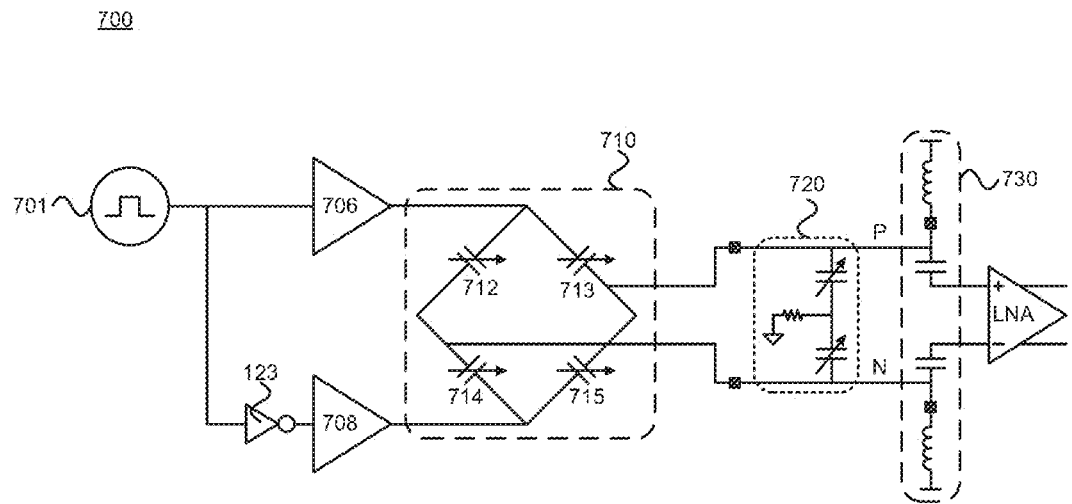
FIG. 7 a band pass filter and an LC tank which may be part of an analog front end of a fingerprint sensing circuit, according to one embodiment.

FIG. 7 illustrates on embodiment of BPF 122 from FIGS. 1, 2, and 3. The differential inputs from RX MUX 111 may be gained and through amplifiers 706 and 708 and coupled to a capacitive sensing bridge 710. Capacitive bridge may include a number of variable capacitors (712-715), the values of which may be set by control registers and executed by a processing unit (not shown). The differential output of the capacitive bridge may be to LC tank 730. LC tank 730 may be constructed from a pair of inductors 721 and a pair of capacitors. In one embodiment, LC tank 730 may be constructed from internal capacitors and external inductors. However in various other embodiments, the constituent parts of LC tank 730 may be external, internal or some combination thereof. In particular, a combination of internal and external capacitors may be used. In other embodiments, other BPF types may be used, such as state variable filters.

The outputs of LC tank may be coupled to a variable gain amplifier (125 of FIG. 1). LC tank 730 may be tuned to the resonant frequency to provide the maximum possible signal to VGA 125, and ultimately the processing circuitry. Tuning of LC tank 730 may be completed using Cap DAC 720. In one embodiment, Cap DAC 720 may include two variable capacitors coupled between the inductors with a resistance to ground between the two variable capacitors. A calibration clock signal may be supplied to LC tank 730 using additional capacitors. The calibration clock my provide a larger input signal during calibration and may be used to more accurately determine the resonance peak.

LC tank 730 may be reset at the start of every scan of an mutual capacitances of sensor grid 101. Resetting LC tank may provide uniform initial conditions to the capacitance measurement and reduce transient time, thus reducing noise in the processed capacitance values by channel engine 140 and CPU interface 160.

Figure 8:
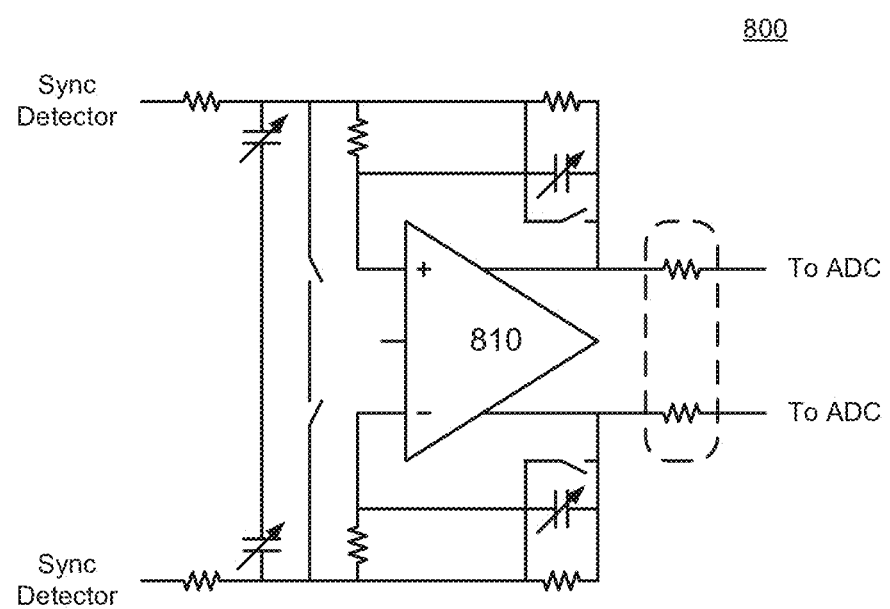
FIG. 8 illustrates a low pass filter which may be part of an analog front end of a fingerprint sensing circuit, according to one embodiment.

FIG. 8 illustrates one embodiment of LPFs 130 and 132 of FIGS. 1, 2, and 3. LPFs 130 and 132 may be constructed as tunable Butterworth filters (such as Butterworth filter 800) built around a differential amplifier 810 with balanced outputs. The balanced outputs of Butterworth filter 800 may be passed to ADCs 134 and 136 of FIG. 1. In one embodiment, the filter cut-off frequency of LPFs 130 and 132 may be tuned using-variable capacitors, which may be on-chip or external to the sensing IC.

Figure 9:
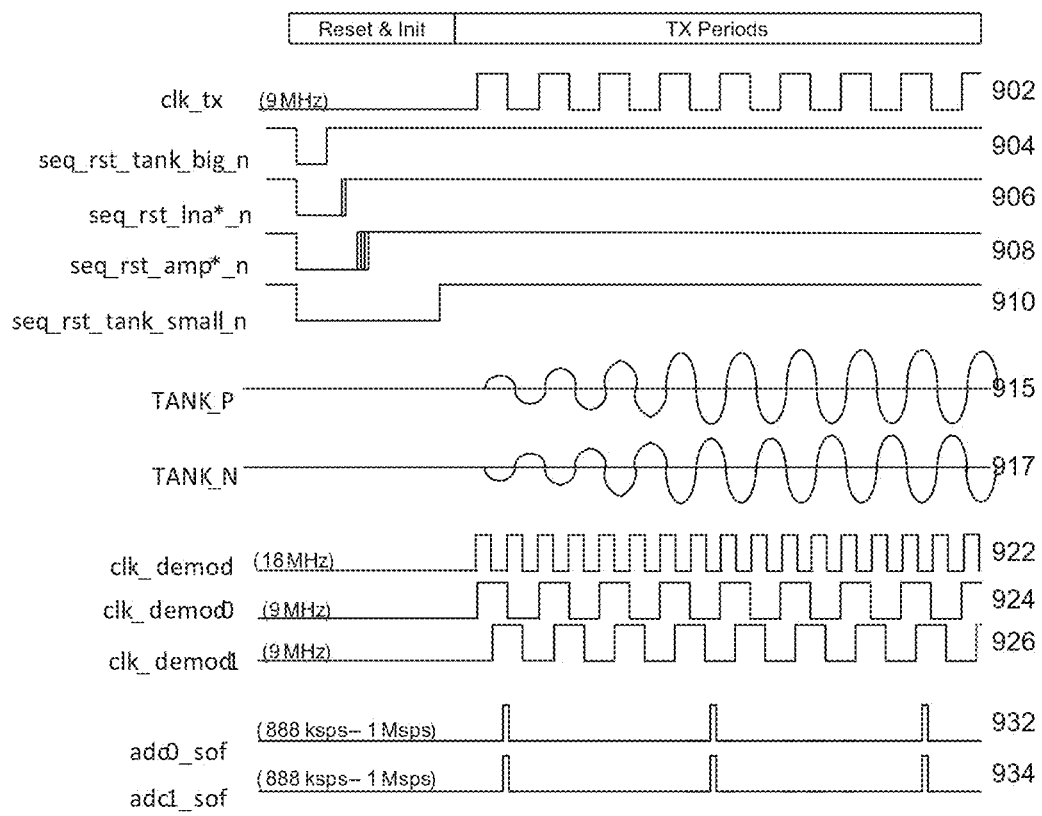
FIG. 9 illustrates reset and initialization signals as well as resultant signals of a band pass filter of a fingerprint sensing circuit, according to one embodiment.

FIG. 9 illustrates one embodiment of control and output signals of the fingerprint sensing circuit 100 of FIG. 1. A 9 MHz clock signal may be provided to the TX drive signal to provide the drive signal to TX MUX 112 and column electrodes 103.1-103.N. During a reset and initialization phase, the various components of fingerprint sensing circuit may be initialized with by pulling the signal on them LOW. LC tank 730 may be reset with signal 904. Resetting LC tank 730 may provide a uniform starting voltage by which to measure the differential voltages of the fingerprint sensing circuit. After LC tank 730 is reset, the low noise amplifier (LNA) may be reset with signal LNA reset signal 906. The programmable gain amplifier may be reset with amplifier reset signal 908. The smaller capacitors of LC tank 730 may then be reset using LC tank reset signal 910. In one embodiment, all of the circuit elements may be reset (pulled low) simultaneously and released from active low in succession to ensure that each element is properly reset. In other embodiments, each circuit element may be reset in turn and after the previous circuit element is out of reset.

Once all of the components of the fingerprint sensing circuit 100 have been reset and initialized, the drive signal derived from TX clock signal 902 may generate a voltage signal on the P and N inputs of LC tank 730. Demodulation clock signals 924 and 926 may be used to gain the signal on the P and N outputs of LC tank 730. In one embodiment, demodulation clock signals 924 and 926 may be derived from a single demodulation clock signal 922.

The analog-to-digital conversion of AFE 120 may be initiated with ADC enable signals 932 and 934. Enabling the ADCs 134 and 136 with signals 932 and 934, respectively may begin the analog-to-digital conversion, thus producing the output of each passed to channel engine 140 and the method of FIG. 4 or 5 may begin.

Figure 10:
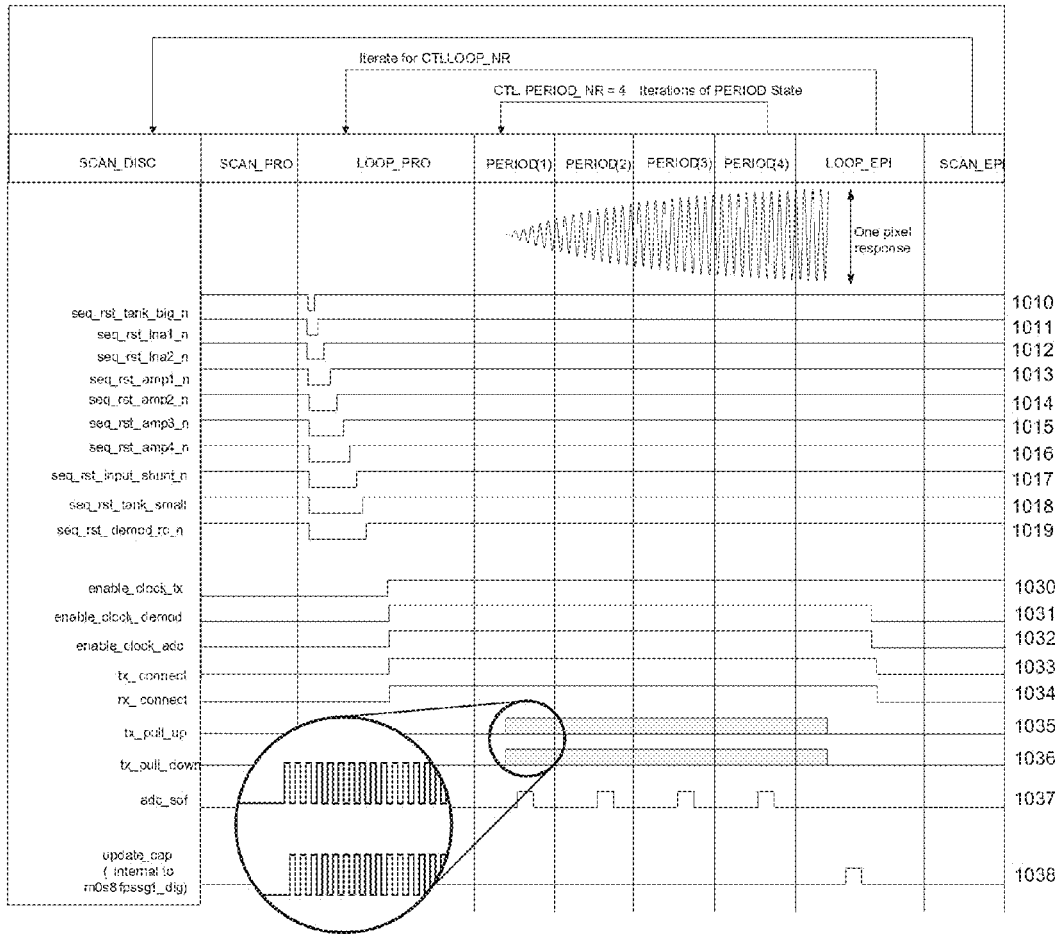
FIG. 10 illustrates control and initialization signals of a fingerprint sensing circuit, according to one embodiment.

FIG. 10 illustrates another embodiment of timing and control signals as well as output of various circuit elements of FIG. 1. Each of the signals and steps of FIG. 11 may be repeated for each pixel of sensor grid 101 of FIG. 1. The LC tank may be reset with signals 1010 and 1018. The larger reset may happen first, in one embodiment, causing the smaller reset to occur after the input of the demodulator is shunted with signal 1017. In one embodiment, there may be multiple LNAs which may be reset in order. In the embodiment of FIG. 10, there are two LNAs. The reset signal of signal of the second 1012 may be held low for longer than the reset signal of the first 1011. After the LNAs are reset, the amplifiers of fingerprint sensing circuit 100 may be reset. In the embodiment of FIG. 10, there are four amplifiers. All of the amplifiers are reset at once, but the signals for each are held low longer than the previous to ensure that everything is reset.

The clocks of the TX drive circuit, the clock demodulator, and the ADC clock may be enabled by signals 1030, 1031, and 1032, respectively. In one embodiment, the TX clock signal 1030 may be enable through the entire measurement cycle for the pixel, while the demodulator and the ADC clocks may be disabled once the measurements have been completed. Row and column electrodes may be coupled to the receive and drive circuits corresponding to the RX and TX connect signals 1033 and 1034. In one embodiment, the row and column electrodes may be coupled to the receive and drive circuits for longer than the demodulation and ADC circuits are enabled.

To control the drive circuit, the row electrodes of fingerprint sensing circuit 100 may be pulled up and pulled down by TX pull up signal 1035 and TX pull down signal 1036. The pull up and pull down signals may generate the differential signals from RX MUX 111 as the signals are coupled from the row electrodes to the column electrodes. The analog to digital conversion may be initialized by signal 1037 the results passed to the channel engine 140 for processing according to methods 400 and 500 of FIGS. 4 and 5, respectively.

FIG. 11 illustrates another embodiment of an AFE 1120 that may be used in fingerprint sensing circuit 100. AFE 1120 may include BPF 122, ports 123 and 124, and VGA 125 as described with regard to FIG. 1. The output of VGA 125 may be a single output coupled to a single synchronous detector channel 1129 to create a pseudo-quadrature channel. The phase of the mixer clock input to multiplexer 1128 may be shifted by 90 degrees through phase shift block 1127. The output of the single synchronous detector channel 1129 may be coupled to a single LPF 1130 and to a single ADC 1134. Samples from ADC 1134 may be gathered in two cycles and processed through multiplexer 1141 to processing by the channel engine 1140 separately, as described with regard to FIGS. 1, 4 and 5.

Figure 12:
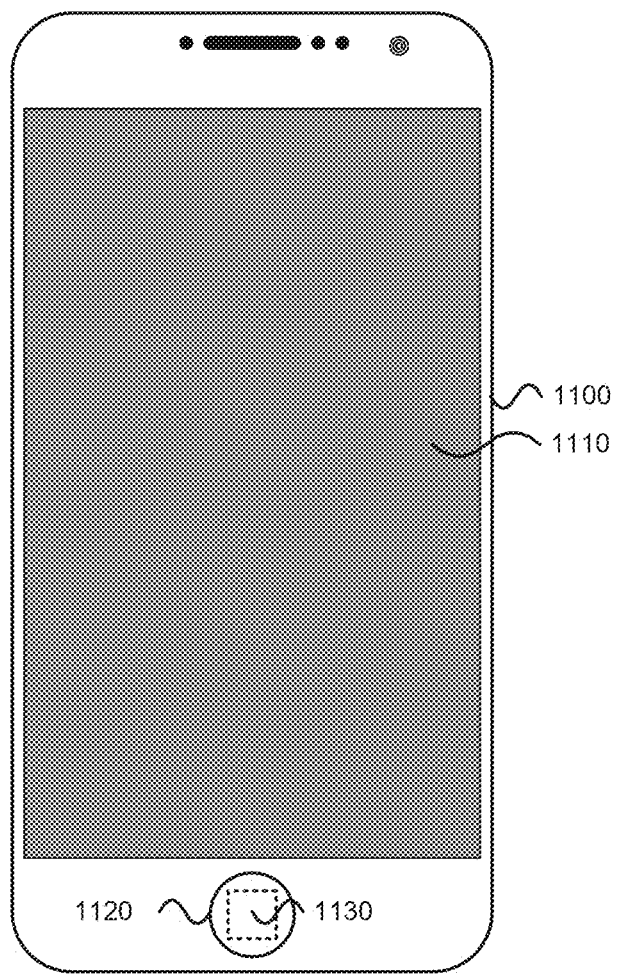
FIG. 12 illustrates a system including a fingerprint sensor, according to one embodiment.

FIG. 12 illustrates one embodiment of a system that includes fingerprint sensing circuit 100 from FIG. 1. The system may be a cellular phone 1200 with a display area 1210. Display area may be disposed beneath a plurality of conductive traces such that a touchscreen interface is constructed. Cellular phone 1200 may also include a button 1220 disposed on the face of cellular phone for user interaction. A fingerprint sensor 1230 may be disposed as part of button 1220. In one embodiment, fingerprint sensor 1230 may be integrated with button 1220, directly below an overlay material. In other embodiments, fingerprint sensor may be a separate element disposed near, but not integrated with button 1220. In still another embodiment, fingerprint sensor 1230 may be disposed elsewhere on the phase of cellular phone 1200.

While a cellular phone is described with regard to FIG. 12, one or ordinary skill in the art would understand that a fingerprint sensor may be used with any user interface device, such as a tablet, a laptop computer, or other computing devices.

Figure 13:
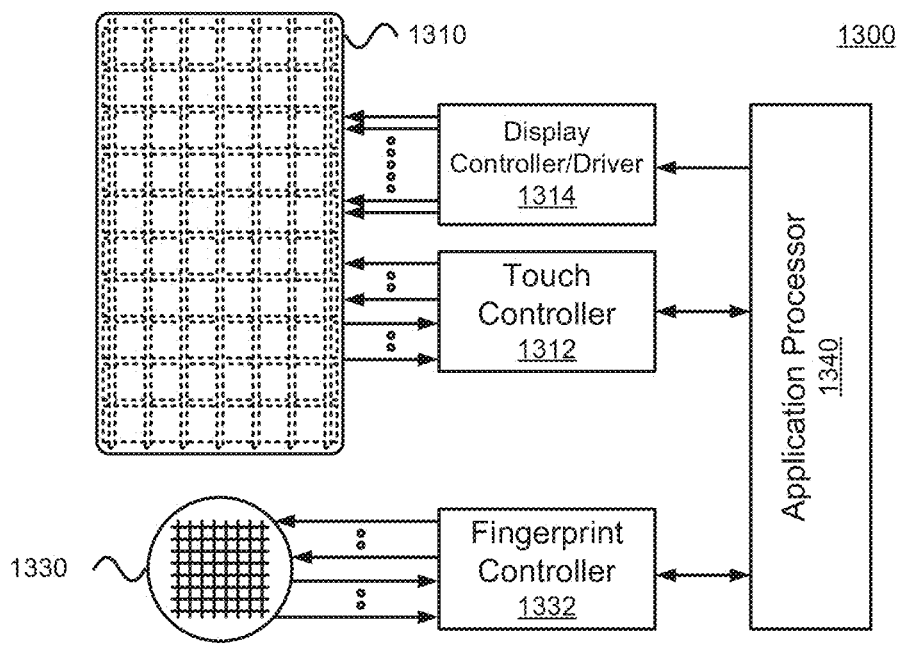
FIG. 13 illustrates another system including a fingerprint sensor, according to one embodiment.

FIG. 13 illustrates one embodiment of a system 1300 that includes a fingerprint sensing circuit similar to that described with regard to FIG. 1. A touchscreen display 1310 may include a display unit, such as an LCD, and sensing electrodes disposed over the surface of the display to detect a user's finger. Display Controller/Driver 1314 may be configured to control what is shown on touchscreen display 1310. Touch controller 1312 may be configured detect a user's finger using any commonly used sensing method. The output of the touch controller 1312 may be communicated to an application processor 1340, which may also communicate to display controller/driver 1314. Touch controller 1312 may also be configured to receive commands and data from application processor 1340. Fingerprint controller 1332 may be configured to communicate with application process 1340 to provide security functions to system 1300. Fingerprint controller may be configured to detect and distinguish fingerprints on fingerprint sensor 1330.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "integrating," "comparing," "balancing," "measuring," "performing," "accumulating," "controlling," "converting," "accumulating," "sampling," "storing," "coupling," "varying," "buffering," "applying," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form.

Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and circuits presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A fingerprint sensing circuit comprising:
   at least two inputs of a plurality of inputs coupled to a plurality of fingerprint sensing electrodes and to an analog front end (AFE), wherein the at least two inputs are coupled differentially to the AFE through a multiplexor, the AFE configured to generate at least one digital value in response to a mutual capacitance between the at least two of the plurality of fingerprint sensing electrodes and at least two drive electrodes, wherein the AFE comprises a quadrature demodulation circuit configured to generate at least one demodulated value;
   a channel engine configured to generate a capacitance result value based on the at least one demodulated value; and
   a memory configured to store the mutual capacitance result generated by the channel engine.

2. The fingerprint sensing circuit of claim 1, wherein the quadrature demodulation circuit comprises:
   at least two demodulator inputs, each input coupled to a modifier, the modifier driven by a phase-shifted reference signal;
   a plurality of low pass filters coupled to an output of the multipliers, and
   a plurality of analog-to-digital converters (ADCs) coupled to an output of the low pass filters, the ADCs configured to generate a digital value derived from a capacitance on the at least one of the plurality of fingerprint sensing electrodes.

3. The fingerprint sensing circuit of claim 2, wherein the low pass filters are reconfigurable for each of the plurality of fingerprint sensing electrodes, the low pass filters configured to maximize signal-to-noise ratio (SNR).

4. The fingerprint sensing circuit of claim 1, further comprising a variable gain amplifier coupled between the plurality of fingerprint sensing electrodes and the demodulation circuit.

5. The fingerprint sensing circuit of claim 1, wherein the differential outputs are combined by the channel engine.

6. The fingerprint sensing circuit of claim 5, wherein the combination includes:
   a squaring step, wherein each of the outputs is squared;
   a summing step, wherein the squared outputs are combined;
   a square root step, wherein the square root of the combined output is generated.

7. The fingerprint sensing circuit of claim 1, wherein the plurality of fingerprint sensing electrodes includes:
   a first plurality of drive (TX) electrodes; and
   a second plurality of receive (RX) electrodes, wherein:
      at least two of the first plurality of TX electrodes are driven concurrently, and
      a receive signal on at least two of the second plurality of RX electrodes are received concurrently, the receive signal generated from a current induced on the at least two of the second plurality of RX electrodes in response to the a TX signal on the at least two of the first plurality of TX electrodes.

8. A method comprising:
   receiving a pair of differential signals from at least two sensing electrodes of a plurality of sensing electrodes of a fingerprint sensing array disposed along a first axis in response to a drive signal from a pair of drive electrodes disposed substantially orthogonal to and intersecting the at least two sensing electrodes, the received signal derived from the drive signal on the pair of drive electrodes and a mutual capacitance between the drive electrodes and the sensing electrodes;

modifying the differential signal with at least one phase-shifted reference signal to produce a phase-shifted signal;

converting the phase-shifted signal to a phase-shifted digital value; and processing the digital value to produce a result representative of the mutual capacitance between one of the pair of sensing electrodes and one of the pair of drive electrodes.

9. The method of claim 8, wherein the signal for each of the plurality of sensing electrodes is modified by at least one phase-shifted signal, and wherein the phase-shifted reference signals are shifted 90 degrees relative to each other.

10. The method of claim 8, wherein the phase-shifted signal is filtered by a reconfigurable low pass filter prior to conversion to the phase-shifted digital value.

11. The method of claim 8, wherein the processing of the digital value comprises:

squaring the phase-shifted digital value;

summing the phase-shifted digital value with at least one other phase-shifted digital value; and calculating a square root of the sum of the phase-shifted digital values.

12. The method of claim 8, wherein the digital value stored in a memory and processed to determine the presence of a ridge or valley of a fingerprint on the fingerprint sensing array.

13. The method of claim 8, wherein the receiving of the signal from at least plurality of sensing electrodes of the fingerprint sensing array is controlled by a multiplexer coupled between the at least one sensing electrode and an analog front end (AFE).

14. A fingerprint detection system comprising:

a plurality of drive (TX) electrodes disposed along a first axis;

a plurality of receive (RX) electrodes disposed along a second axis, wherein the TX electrodes and the RX electrodes are configured to have a mutual capacitance at each intersection of the TX electrodes and the RX electrodes;

a drive circuit coupled to the TX electrodes, the drive circuit configured to produce a TX signal on the TX electrodes, wherein at least two TX electrodes are driven by the drive circuit concurrently;

an analog front end (AFE) coupled to the RX electrodes, the AFE configured to generate a digital value representative of the mutual capacitance, wherein the AFE comprises a quadrature demodulation circuit configured to generate a demodulated signal, and wherein at least two RX electrodes are coupled to the AFE differentially;

a channel engine configured to generate a capacitance result value based on the at least one digital value;

a scan control circuit to configure a first multiplexer coupled between the drive circuit and the plurality of TX electrodes and to configure a second multiplexer coupled between the AFE and the plurality of RX electrodes; and a memory configured to store the capacitance result value generated by the channel engine.

15. The fingerprint detection system of claim 14, wherein the channel engine is configured to operate using a hardware accelerator circuit.

16. The fingerprint detection system of claim 14, wherein the quadrature demodulator comprises at least two modulator inputs, each input coupled to a modifier, the modifier driven by a phase-shifted reference signal;

a plurality of low pass filters coupled to an output of the modifiers, and a plurality of analog-to-digital converters (ADCs) coupled to an output of the low pass filters, the ADCs configured to generate a digital value derived from a capacitance on the at least one of the plurality of sensing electrodes.

17. The fingerprint detection system of claim 14, wherein the capacitances of the sensing electrodes are processed by the AFE concurrently, each on a differential channel to produce a differential output for each sensing electrode.

* * * * *